(12) United States Patent
Doiron et al.

(10) Patent No.: US 7,453,708 B2
(45) Date of Patent: Nov. 18, 2008

(54) HIGH RELIABILITY MODULE

(75) Inventors: David Doiron, Ashburnham, MA (US);
Weidong Zhuang, Worcester, MA (US);
Weiping Hu, Westford, MA (US);
Michael McGonigle, Humarock, MA (US)

(73) Assignee: International Rectifier Corporation, El Segundo, CA (US)

( * ) Notice: Subject to any disclaimer, the term of this patent is extended or adjusted under 35 U.S.C. 154(b) by 384 days.

(21) Appl. No.: 10/983,468

(22) Filed: Nov. 8, 2004

(65) Prior Publication Data

US 2005/0111798 A1    May 26, 2005

Related U.S. Application Data

(60) Provisional application No. 60/518,408, filed on Nov. 7, 2003.

(51) Int. Cl.
*H01R 9/00* (2006.01)

(52) U.S. Cl. .................................................. 361/823
(58) Field of Classification Search ............... 361/823, 361/434; 385/100, 138
See application file for complete search history.

(56) References Cited

U.S. PATENT DOCUMENTS

| 4,516,820 | A  | * | 5/1985 | Kuzma ........................ 439/289 |
| 6,078,501 | A  | * | 6/2000 | Catrambone et al. ......... 361/704 |
| 6,275,369 | B1 | * | 8/2001 | Stevenson et al. ........... 361/302 |
| 6,641,942 | B1 | * | 11/2003 | Rouillard et al. ............... 429/7 |
| 2004/0175092 | A1 | * | 9/2004 | Young et al. ................. 385/138 |

* cited by examiner

*Primary Examiner*—Jeremy C. Norris
*Assistant Examiner*—Abiy Getachew
(74) *Attorney, Agent, or Firm*—Ostrolenk, Faber, Gerb & Soffen, LLP

(57) ABSTRACT

A module which includes a hermetically sealed housing and a terminal block which is integrated with the hermetically sealed housing to provide electrical connection to external devices.

21 Claims, 7 Drawing Sheets

HIGH RELIABILITY MODULE

RELATED APPLICATION

This application is based on and claims benefit of U.S. Provisional Application No. 60/518,408, filed Nov. 7, 2003, entitled High Reliability Module to which a claim of priority is hereby made and the disclosure of which is incorporated by reference.

BACKGROUND OF THE INVENTION

Electronic power modules are generally known for providing electrical power to circuits and devices such as motors, actuators, controllers etc. For applications requiring high reliability and high power, the modules are preferably hermetically sealed to prevent infiltration of moisture, dust or other contaminants into the module interior which can cause impairment or failure.

High power, hermetically sealed modules are usually custom-made and application-specific, and may not conform to industry/commercial standard configurations or outlines. As a result, unlike commercial modules, high reliability power modules are often very expensive. Thus, when a module is required for a high reliability application, the end user must expend a considerable amount of capital for obtaining samples in order to test and qualify the module for its use.

Furthermore, it is customary to make high reliability power modules with a metallic housing that is hermetically sealed. According to the conventional design, the interconnects for electrically connecting the components within the housing to external devices extend through the metallic body of the housing, but are insulated from the same by glass or the like. Kovar is a desirable material for forming interconnects in conventional designs in that Kovar has thermal characteristics similar to glass. However, Kovar's electrical resistivity undesirably increases the overall resistivity of the prior art modules.

BRIEF SUMMARY OF THE INVENTION

A module according to the present invention is adapted for high reliability applications, but includes features that allow it to be scaled for commercial and industrial applications as well.

A module according to the present invention includes a hermetically sealed housing containing components such as power semiconductor devices, and a terminal block which is electrically integrated with the hermetically sealed housing.

According to an aspect of the present invention the terminal block may be designed to fit a commercial or industrial configuration which can be provided to end users for testing and qualification separate from the high reliability, hermetically sealed housing. That is, the terminal block can be provided with a non-hermetic (less expensive) housing to the end user for testing and qualification. As a result, the cost of testing and qualification of the high reliability module for an end user is reduced.

Specifically, a module according to the present invention includes a hermetically sealed housing having a base, sidewalls, a lid, and hermetically sealed interconnects extending from the interior of the housing to the exterior thereof, and a terminal block which includes a lead frame embedded in a molded body. The leads of the lead frame are electrically connected to the interconnects and are adapted for external connection to external devices or electronic circuits.

According to an aspect of the present invention, the hermetically sealed housing can be replaced with a non-hermetic housing, which is less expensive, to reduce the cost of the same.

According to another aspect of the invention the hermetically sealed interconnects are formed from a low electrical resistivity material such as copper.

According to yet another aspect of the present invention each interconnect extends through a stress relief collar that is hermetically attached to a wall of the hermetically sealed housing.

According to a further aspect of the present invention the stress-relief collars are bell-shaped.

According to another aspect of the present invention the stress-relief collars are formed from Kovar.

According to an additional aspect of the invention the sidewalls of the hermetically sealed housing are formed from a material different from the base of the hermetically sealed housing. As a result, the exterior surface of the base of the housing is convex without extra machining steps, thereby reducing the cost of the module. In the preferred embodiment, the housing sidewalls are made from alloy 46 and the base is a moly base plate.

According to a further aspect of the present invention the lid of the hermetically sealed housing includes at least one rib as a reinforcement which assists in preventing the sidewalls of the housing from curving inwardly, thereby adding strength to the plate and the housing as a whole.

Other features and advantages of the present invention will become apparent from the following description of the invention which refers to the accompanying drawings.

DETAILED DESCRIPTION OF THE EMBODIMENT

Figure 1:
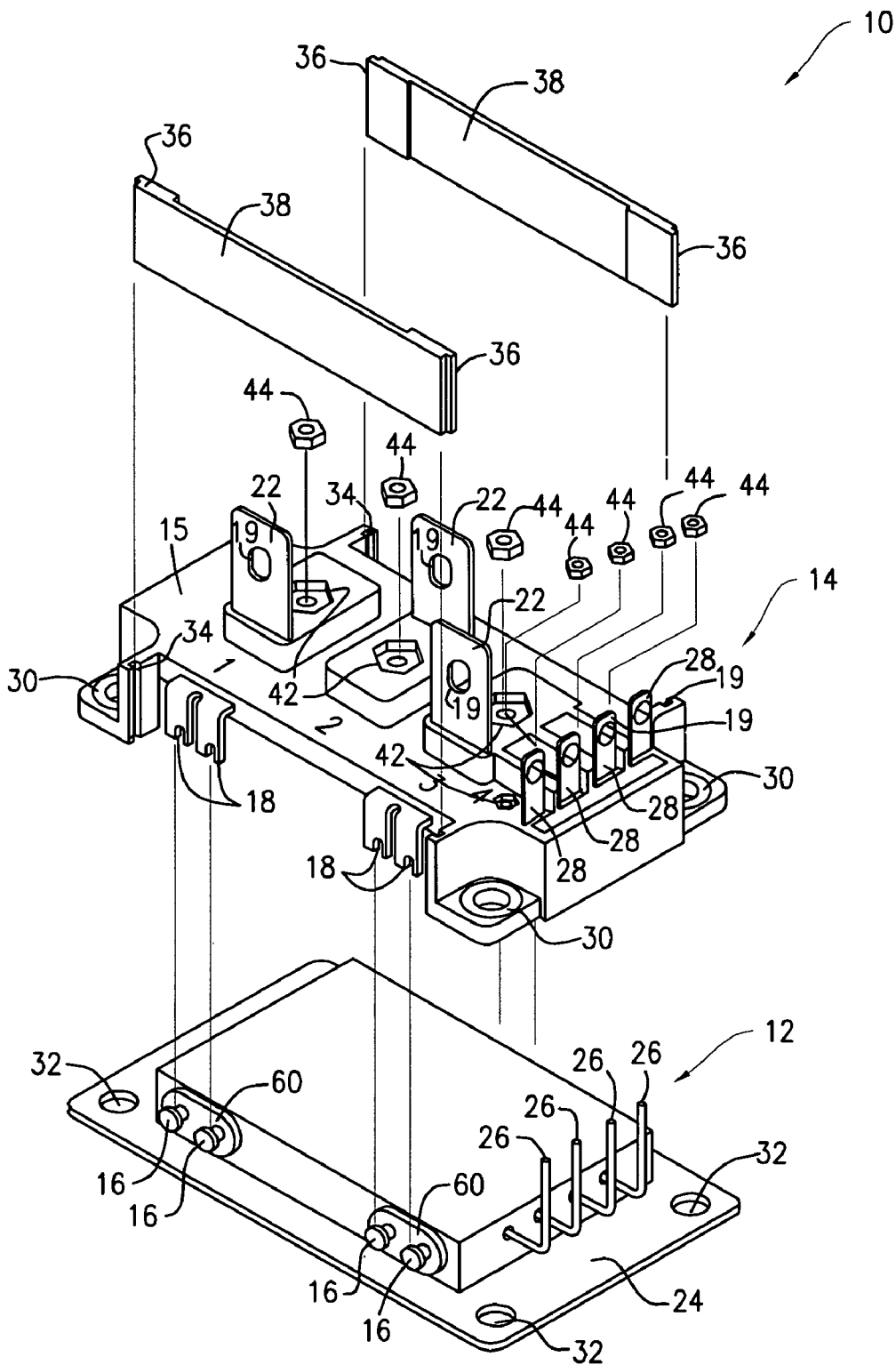
FIG. 1 is an exploded view of a module according to the present invention.
Figure 2:
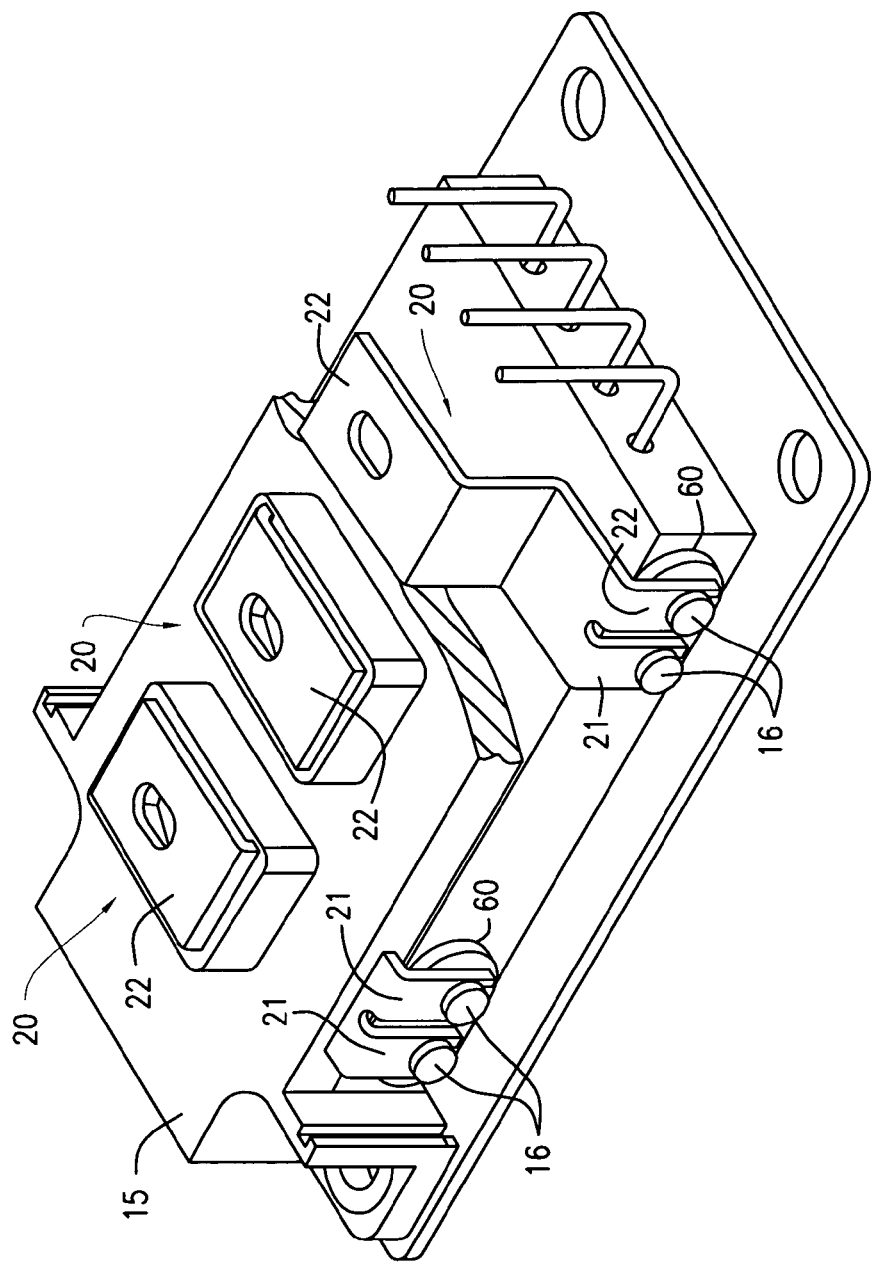
FIG. 2 is a perspective view of a module according to the present invention which has a portion thereof removed to illustrate internal components.

Referring to FIG. 1, a module 10 according to the present invention includes a hermetically sealed housing 12, and a terminal block 14. Hermetically sealed housing 12 includes power interconnects 16. Power interconnects 16 serve as power transmission conduits to transmit power to and from the components contained within housing 12, and are adapted to be electrically integrated with terminal block 14. Specifically, terminal block 14 includes a molded body 15, and a lead frame which is embedded within molded body 15. The lead frame includes a plurality of power leads 20 (FIG. 2) having an end 21 that includes at least one recess 18 adapted for receiving, and electrically connecting to a corresponding interconnect 16. Each power lead 20 further includes a free end 22 which is adapted for electrical connection to an external device (e.g. a motor) and/or a circuit.

In addition to power interconnects 16, hermetically sealed housing 12 further includes control signal interconnects 26. Control signal interconnects 26 are provided to transmit control signals from an external control circuit to corresponding components contained within hermetically sealed housing 12. The lead frame embedded within molded body 15 of terminal block 14 further includes control leads 28. Each control lead 28 includes an aperture large enough to receive the free end of a corresponding control signal interconnect 26, as seen, for example, in FIG. 3. Solder or the like may be used to secure a control signal interconnect 26 to a corresponding control lead 28 and a power interconnect 16 to a corresponding power lead 20.

Terminal block 14 further includes mounting rings 30 embedded in molded body 15 thereof. Mounting rings 30 are preferably comprised of brass or a similar material and are positioned to register with corresponding mounting holes 32 of hermetically sealed housing 12. Thus, terminal block 14 and hermetically sealed housing 12 can be together mounted on a heatsink or the like using appropriate mounting hardware such as mounting screws.

Figure 3:
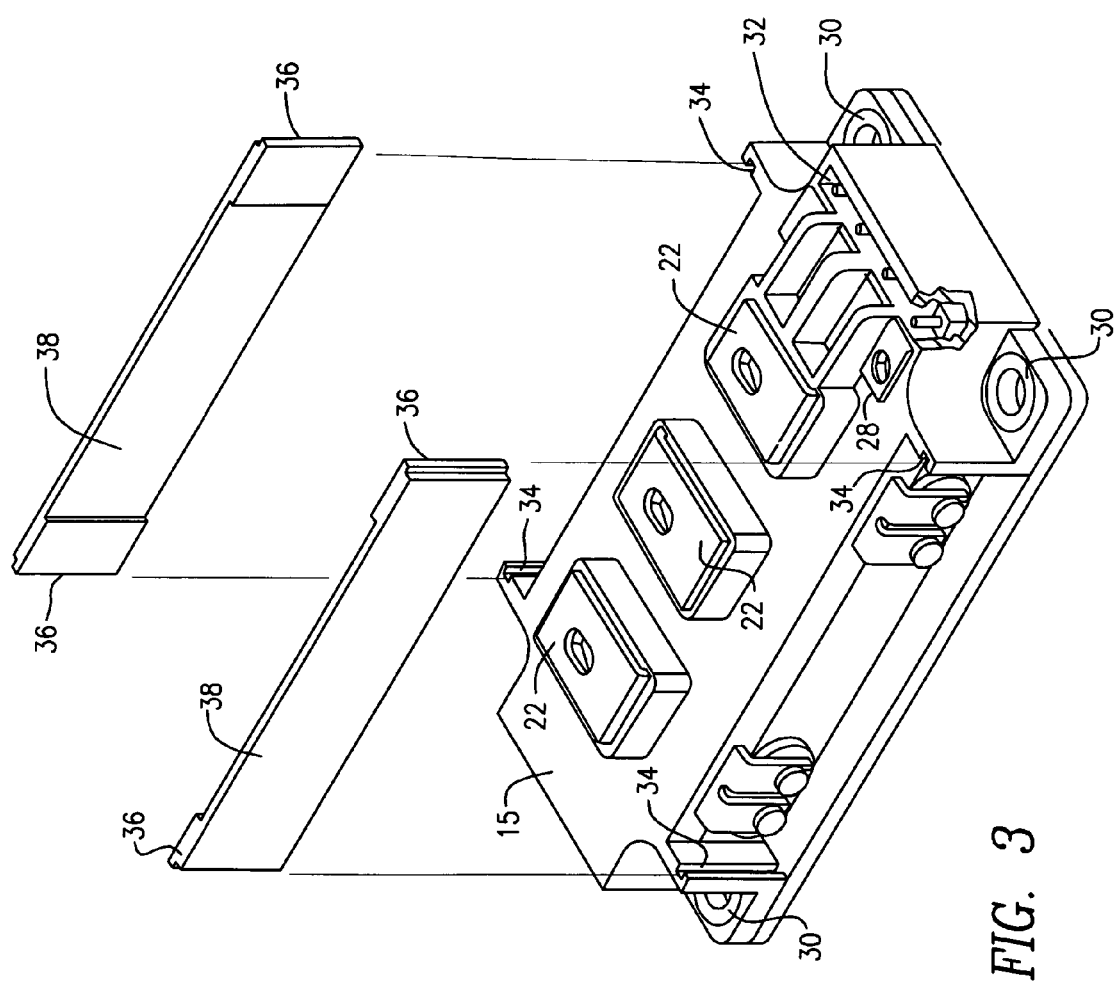
FIG. 3 is a perspective view of a partially assembled module according to the present invention.
Figure 4:
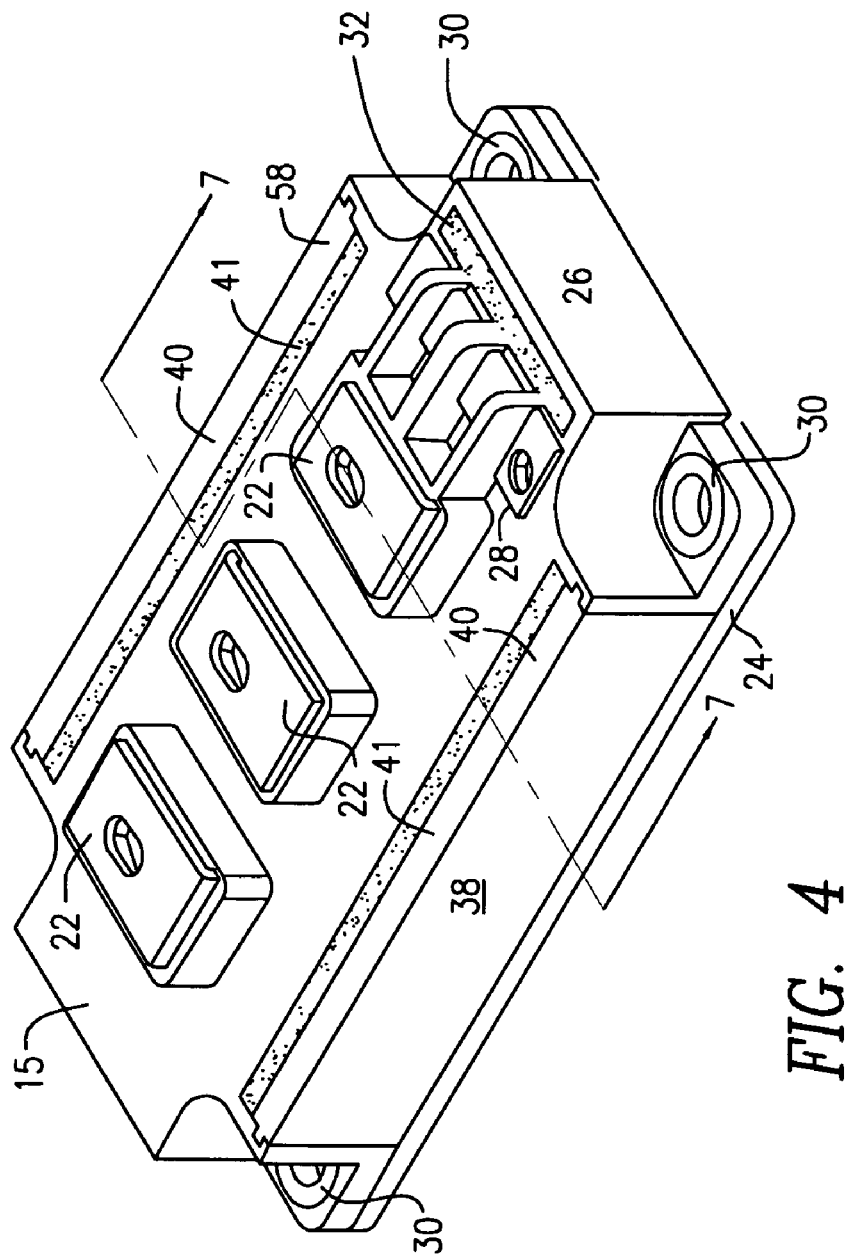
FIG. 4 is a perspective view of a module according to the present invention as assembled.

It should be noted that molded body 15 includes compartment 32 in which control signal interconnects 26 are received as seen in FIG. 3. Furthermore, molded body 15 includes slots 34 each for receiving a corresponding lip portion 36 of a respective side panel 38. Referring to FIG. 4, once each panel 38 is received by a corresponding pair of slots 34, a compartment 40 is created around power interconnects 16 and portions of power leads 20 connected thereto. Potting compound 41 or the like may be disposed within compartments 32,40 in order to protect interconnects 16,26 and leads 20,28 attached thereto from environmental damage.

It should be noted that to facilitate external connection, molded body 15 is provided with a plurality of recesses 42. Each recess 42 is adjacent a respective lead 20, 28 and is adapted to receive a respective nut 44. Once a nut 44 is received in a respective recess 42, its adjacent lead 20, or 28 is bent over the same to prevent nut 44 from falling out. As seen, for example, in FIGS. 1-4, each lead 20, 28 is provided with an aperture 19 which registers with a corresponding nut 44 and allows access to the same so that a screw or the like may be used to secure a connection to each lead 20, 28.

Figure 5:
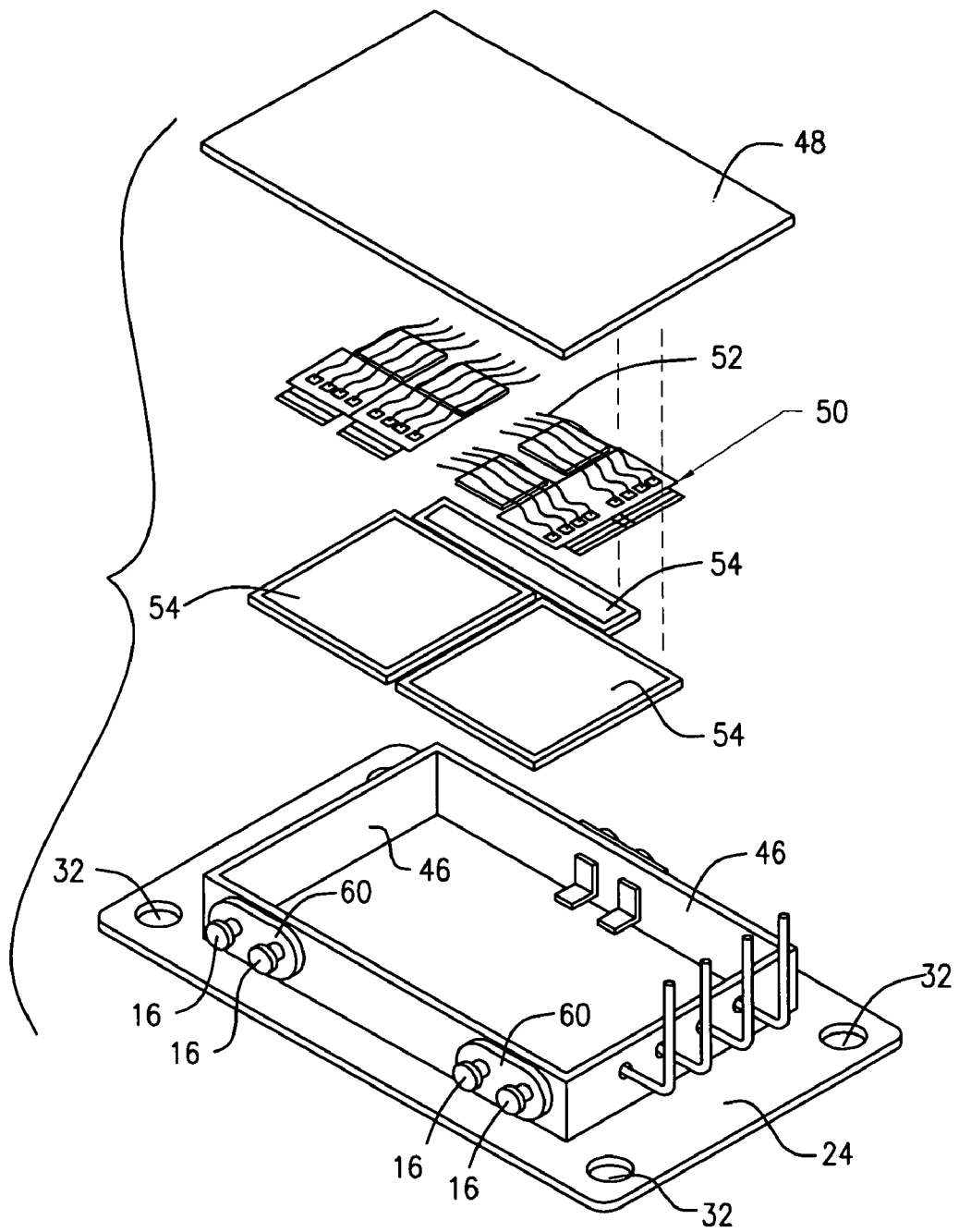
FIG. 5 is an exploded view of the housing portion of a module according to the present invention.
Figure 6:
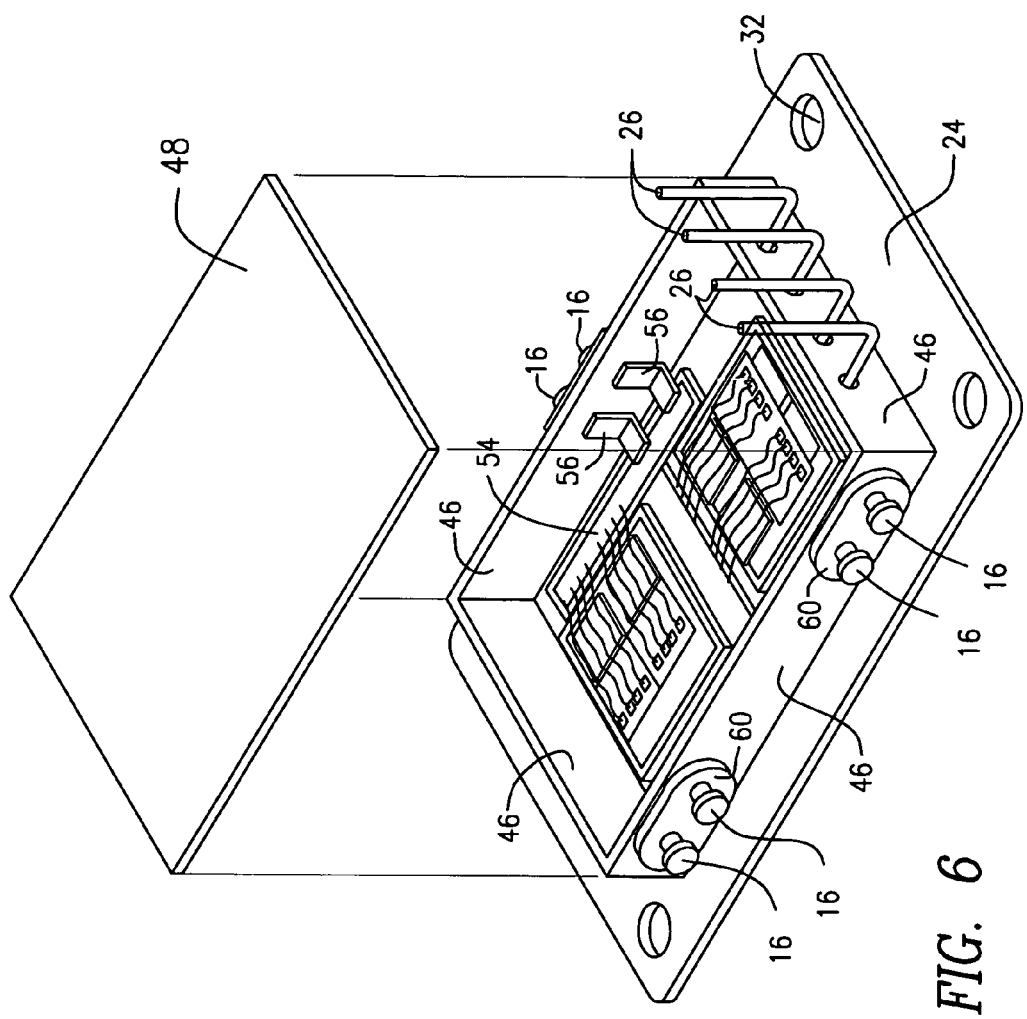
FIG. 6 is a partially assembled perspective view of the housing portion of a module according to the present invention.

Referring now to FIG. 5, hermetically sealed housing 12 includes a plurality of walls 46 hermetically attached to base 24, and lid 48. Walls 46 are arranged on base 24 to define a space for receiving electronic components. In the preferred embodiment of the present invention, the electronic components received in the space defined by walls 46 are power semiconductor devices 50 such as power MOSFETs, schottky diodes or the like which are electrically connected to one another by wire bonds 52 or the like to form an appropriate portion of a power circuit. To thermally connect, but electrically insulate, power semiconductor devices 50 from base 24 thermally conductive circuit boards 54 such as direct bonded copper (DBC), or insulated metal substrate (IMS) are attached to base 24 and power semiconductor devices 50 are disposed on the same as seen in FIG. 6. Thus, the heat generated by power semiconductor devices 50 during operation can be transmitted through circuit boards 50 to base 24 and dissipated by a heatsink (not shown) attached thereto.

Furthermore, the electronic components contained within housing 12 are electrically connected to interconnects 16, 26. Thus, for example, power interconnects 16 may be electrically connected to the power terminals of the power semiconductor devices 50, while control interconnects 26 may be electrically connected to the control electrodes of the power semiconductor devices 50, where appropriate. As seen, for example, in FIG. 6, electrically conductive strips 56 can be used to electrically connect the components contained within housing 12 to corresponding power interconnects 16. To complete housing 12 lid 48 is hermetically attached to walls 46.

According to one aspect of the present invention, terminal bock 14 may be integrated with a less expensive, non-hermetic housing in order to reduce the cost of the same.

Figure 7:
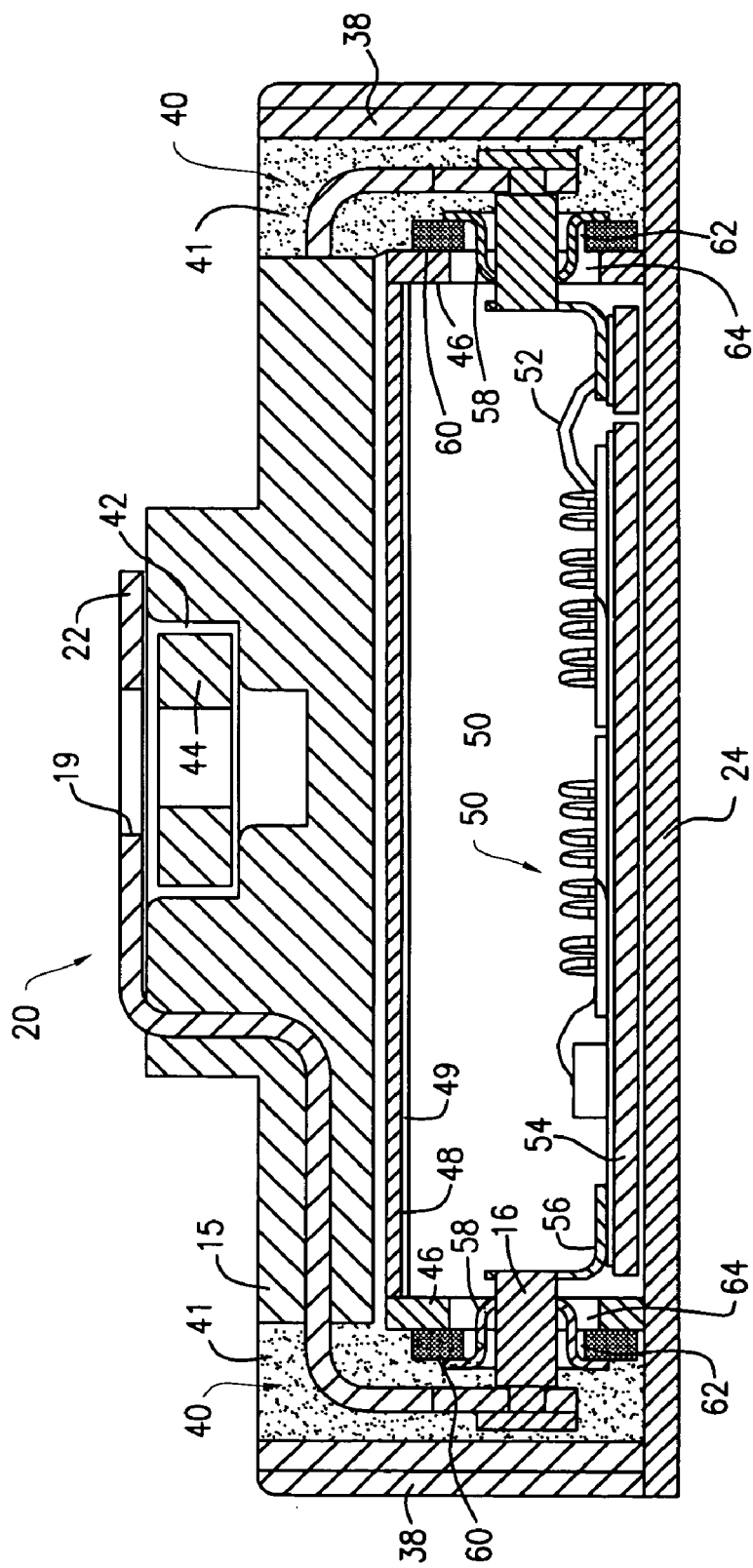
FIG. 7 is a cross-sectional view of a module according to the present invention taken along line 7-7 in FIG. 4, and viewed in the direction of the arrows.

Referring now to FIG. 7, according to one aspect of the present invention, lid 48 includes at least one rib 49. Rib 49 increases the mechanical strength of lid 48 and thus prevents flexing which may warp the housing.

According to another aspect of the present invention, walls 46 are formed from NiFe (Alloy 46) while base 24 is formed from molybdenum. Due to the slight mismatch in the characteristics of these two materials, base 24 is bent slightly whereby its exterior surface is convexly shaped once housing 12 is constructed. The convex exterior surface is desirable for making a good thermal contact with a heatsink or the like. In modules according to the prior art such a convex shape is attained by machining the exterior surface of base 24, which is costly. In a module according to the present invention the costly machining step is avoided, which is advantageous.

As can be seen, power interconnects 16 and control signal interconnects 26 are fed from the hermetically enclosed interior of housing 12 to the exterior thereof. According to an aspect of the present invention power interconnects 16 as well as control signal interconnects 26 are fed through respective stress relief collars 58. Each collar 58 is in turn hermetically attached to a respective seal member 60 which itself is hermetically attached to a respective wall 46. Each seal member 60 is preferably made from an electrical insulator such as alumina or the like and includes an aperture 62 which registers with an aperture 64 in a respective wall 46 to accommodate at least a portion of a collar 58 and an interconnect 16 disposed therethrough.

According to an aspect of the present invention, collars 58 are bell-shaped. This bell-like shape helps relieve stresses caused by thermal expansion and contraction by bending like a spring. As a result, the reliability of the module is improved.

According to another aspect of the present invention, bell-shaped collars 58 are made from Kovar, while interconnects 16, 22 are made from copper. Using copper to form power interconnects is particularly advantageous in that copper has low electrical resistivity. In the prior art modules, Kovar is used as an interconnect because of its thermal expansion characteristics. This, however, is a drawback because Kovar's electrical resistivity is relatively high. A module according to the present invention is improved compared to the prior art modules in that its overall electrical resistivity is improved while its mechanical reliability is not compromised.

In a module according to the preferred embodiment, the lead frame embedded in terminal block 14 is formed from copper to improve the electrically resistivity of the module, while molded body 15 is formed from a suitable engineering plastic.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A module comprising: a hermetically sealed housing that includes in a hermetically sealed interior thereof a plurality of electrical components, and at least one electrical interconnect electrically connected to at least one of said components in said interior and extending to an exterior of said hermetically sealed portion with a stress relief collar disposed around and hermetically joined with said interconnect; and terminal block having a lead frame wherein said lead frame includes at least one lead having a first end electrically connected to said at least one interconnect and a free end adapted for external connection, wherein said stress relief collar is formed from a first material and a second material; said first material having a higher electrical resistively than said second material.

2. A module according to claim 1, wherein said first material is comprised of Kovar and said second material is comprised of copper.

3. A module according to claim 1, wherein said collar is bell-shaped.

4. A module according to claim 1, wherein said hermetically sealed housing includes a base, a plurality of walls attached to said base and defining boundaries of said interior and a lid, wherein said collar extends from said exterior of said hermetically sealed housing to said interior thereof, and further comprising a seal member disposed around and hermetically joined with said collar.

5. A module according to claim 4, wherein said seal member comprises an electrical insulator.

6. A module according to claim 4, wherein said lid includes a rib to increase the strength thereof.

7. A module according to claim 1, wherein said terminal block further includes a molded body, said lead frame being molded within said molded body.

8. A module according to claim 1, further comprising an exterior compartment which receives said interconnect and potting compound disposed within said compartment to protect said interconnect and said first end of said at least one lead.

9. A module comprising:
a hermetically sealed housing that includes in a hermetically sealed interior thereof a plurality of electrical components, at least one electrical interconnect electrically connected to at least one of said components in said interior and extending to an exterior of said hermetically sealed housing, and a stress-relief collar hermetically attached to and disposed around said interconnect, said hermetically sealed housing including a base, a plurality of walls hermetically attached to said base and defining boundaries of said interior and a lid hermetically attached to said plurality of walls, wherein said collar extends from said exterior of said hermetically sealed housing to said interior thereof.

10. A module according to claim 9, further comprising a seal member disposed around and hermetically joined with said collar.

11. A module according to claim 10, wherein said seal member comprises an electrical insulator.

12. A module according to claim 9, wherein said lid includes a rib to increase the strength thereof.

13. A module according to claim 9, further comprising a terminal block having a lead frame wherein said lead frame includes at least one lead having a first end electrically connected to said at least one interconnect and a free end adapted for external connection.

14. A module according to claim 13, wherein said terminal block further includes a molded body, said lead frame being disposed within said molded body.

15. A module according to claim 13, further comprising an exterior compartment which receives said interconnect and potting compound disposed within said compartment to protect said interconnect and said first end of said at least one lead.

16. A module according to claim 9, wherein said collar is composed of a first material and said interconnect is selected from a second material, said second material having a lower electrical resistivity than that of said first material.

17. A module according to claim 16, wherein said first material is comprised of Kovar and said second material is comprised of copper.

18. A module according to claim 9, wherein said collar is bell-shaped.

19. A module according to claim 9, wherein said plurality of walls are comprised of one material and said base is comprised of another material different from said one material, whereby an exterior surface of said base opposite said interior of said housing is made convex due to the differences in characteristics between said one material and said another material.

20. A module comprising: a housing that includes a plurality of electrical components, and at least one electrical interconnect electrically connected to at least one of said components and extending to an exterior of said housing; and a terminal block portion having a lead frame wherein said lead frame includes at least one lead having a first end electrically connected to said at least one interconnect and a free end adapted for external connection, with a molded body disposed around said lead frame.

21. A module according to claim 20, further comprising an exterior compartment which receives said interconnect and potting compound disposed within said compartment to protect said interconnect and said first end of said at least one lead.

* * * * *